(12) United States Patent
Kim et al.

(10) Patent No.: US 6,638,638 B2
(45) Date of Patent: Oct. 28, 2003

(54) HOLLOW SOLDER STRUCTURE HAVING IMPROVED RELIABILITY AND METHOD OF MANUFACTURING SAME

(75) Inventors: Sang-Young Kim, Cheonan (KR); Ho-Jeong Moon, Cheonan (KR); Dong-Kil Shin, Taejeon (KR); Seung-Kon Mok, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/954,026

(22) Filed: Sep. 18, 2001

(65) Prior Publication Data

US 2003/0052156 A1 Mar. 20, 2003

(51) Int. Cl.[7] .................................................. B22F 3/00
(52) U.S. Cl. ........................ 428/546; 428/576; 228/246
(58) Field of Search ................................ 428/546, 576; 228/180.21, 180.22, 246

(56) References Cited

U.S. PATENT DOCUMENTS

| | | | |
|---|---|---|---|
| 5,410,807 A | 5/1995 | Bross et al. ................... 29/843 |
| 5,468,995 A | 11/1995 | Higgins, III ................ 257/697 |
| 5,767,580 A | 6/1998 | Rostoker ..................... 257/737 |
| 5,868,855 A | 2/1999 | Fukazawa et al. ........... 134/1.3 |
| 5,959,355 A | 9/1999 | Petit ............................ 257/737 |
| 6,122,177 A | 9/2000 | Kitano et al. | |
| 6,204,455 B1 | 3/2001 | Gilleo et al. ................ 174/261 |
| 6,303,408 B1 | 10/2001 | Smith .......................... 438/106 |
| 6,310,301 B1 | 10/2001 | Heinrich et al. ............ 174/260 |
| 6,337,445 B1 | 1/2002 | Abbott et al. ............... 174/260 |

FOREIGN PATENT DOCUMENTS

JP 10-209591 8/1998

OTHER PUBLICATIONS

"Double Sided 4Mb SRAM Coupled Cap PBGA Card Assembly Guide", Application Note, International Business Machines, pp. 1–11 (Feb. 1998).
"MicroStar BGA™ Packaging Reference Guide", Texas Instruments, Literature No.: SSYZ015A, Second Edition, (Sep. 1999) [18 pages].

*Primary Examiner*—Cathy Lam
(74) *Attorney, Agent, or Firm*—Lee & Sterba, P.C.

(57) ABSTRACT

A solder structure comprising a radially-curved exterior surface enclosing a predetermined-sized cavity used for flexibly joining together at predetermined conductive contact points two planar elements having dissimilar properties. By assembling the two planar elements in a tiered arrangement, one planar element having an annular conductive pad and the other planar element having either a corresponding annular or circular conductive pad, separated by a spherical solder compound comprised of solder and a fluxing agent, a hollow solder structure can be created during a melting and subsequent cooling of the solder compound. The plasticity/resiliency characteristics of the resulting hollow solder structure absorbs lateral movement of the two planar elements relative to each other without degradation of the solder joint.

13 Claims, 8 Drawing Sheets

| Board Land Shape | Accumulated Plastic Strain | Accumulated Creep Strain | Total Strain | Acceleration Factor |
|---|---|---|---|---|
| Barrel Void Ball (0.30 Land) | 0.0171 | 0.0198 | 0.0369 | 2.21 |
| Barrel Void Ball (0.35 Land) | 0.00835 | 0.0157 | 0.02405 | 1 |
| Barrel Void Ball (0.40 Land) | 0.02 | 0.0203 | 0.0403 | 2.72 |

FIG.12

| Ball Shape | Accumulated Plastic Strain | Accumulated Creep Strain | Total Strain | Acceleration Factor |
|---|---|---|---|---|
| Normal Shape | 0.0432 | 0.0249 | 0.0681 | 3.28 |
| Bottom Void | 0.0360 | 0.0264 | 0.0624 | 2.77 |
| Top Void | 0.0307 | 0.0311 | 0.0618 | 2.72 |
| Barrel Void | 0.0171 | 0.0198 | 0.0369 | 1 |

FIG. 11

HOLLOW SOLDER STRUCTURE HAVING IMPROVED RELIABILITY AND METHOD OF MANUFACTURING SAME

BACKGROUND OF THE INVENTION

1. Field of the Invention

The present invention relates semiconductor devices having solder balls as an external termination means and, more particularly, to a semiconductor device using a Ball Grid Array (BGA) having improved reliability solder joints and a method for manufacturing the same.

2. Description of the Related Art

A common mounting and electrical-connection mechanism used in integrated circuits (ICs) is a ball grid array (BGA), wherein small solder balls are placed and retained at each one of a multitude of connection pads of the IC for solder connection to a mounting substrate or planar surface having opposing metal connecting pads. When heat is applied, the solder balls liquefy and flow via a fluxing agent included in the solder compound over any exposed metal surfaces of the connection pads, thereby forming a reliable electrical connection with each mounting pad. After cooling, the hardened solder additionally provides a rigid mounting structure for mechanically retaining the IC to the substrate or planar surface.

Typically, the size of the mounting package for the IC can be reduced to the size of a semiconductor chip, thus creating a Chip Size Package or Chip Scale Package (CSP). In the CSP, unlike conventional periphery-leaded (i.e. wire-bonded) packages, an array of external terminals and the BGA solder balls are distributed over the surface of the IC to directly interconnect the package to a printed circuit board (PCB). After processing, the resulting solder structures are generally inelastic, and provide a solid mounting mechanism for the assembly.

Disadvantageously, since the material composition of the chip and the opposing epoxy-glass material of a conventional PCB can have widely mismatched Coefficient of Thermal Expansion (CTE), any thermal cycling effects, such as those normally associated with turn-on and turn-off of related circuitry, can produce differing expansion movement of the opposing planar surfaces. This movement produces lateral shearing stresses on the solder joint, which is absorbed by the solder balls, more specifically by the junction of the solder ball and the metal connecting pads. With repeated thermal cycling, metal fatigue at this junction can cause the solder structure to crack and fail, rendering an entire circuit board inoperable. In other words, when the chip heats up during use, both the chip and the board expand, and when the heat is removed, both the chip and the substrate shrink. The problem that arises is that the chip and the substrate expand and contract at different rates according the CTE, thereby stressing the interconnections or solder balls connecting them.

Figure 1:
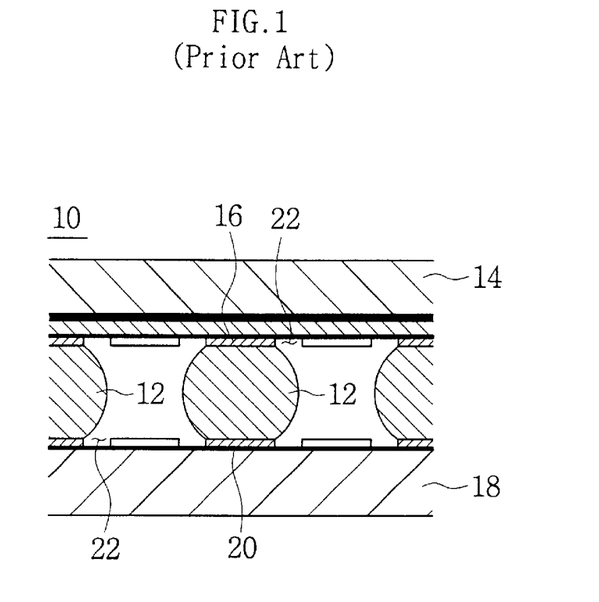
FIG. 1 illustrates a cross-sectional view of a conventional ball grid array (BGA) interface structure having a multitude of solid solder balls.

FIG. 1 illustrates a cross-sectional view of a conventional ball grid array (BGA) interface structure 10 having a multitude of solid solder balls 12. Structure 10 consists of upper planar element 14 having a first metal conductor pad 16 rigidly connected via solder ball 12 to a lower planar element 18 having a second metal conductor pad 20 so as to provide both electrical and mechanical connection between electronic circuits on each of the planar elements. Conductors are separated from lateral neighboring conductors by isolation spaces 22 appropriately located on each planar element. Each of planar elements 14 and 18 can have a different CTE. However, an excessive disparity between the CTEs can produce thermal cycling failure in the form of cracking of the rigid solder joints as previously discussed.

Occasionally, conventional out-gassing of vaporized flux is not completed due to process and/or solder compound irregularities, such as insufficient wetting of the solder compound, and results in small voids being located at the conductor-solder interface. Such voids create an area of fatigue weakness in the resulting joining structure.

Figure 2:
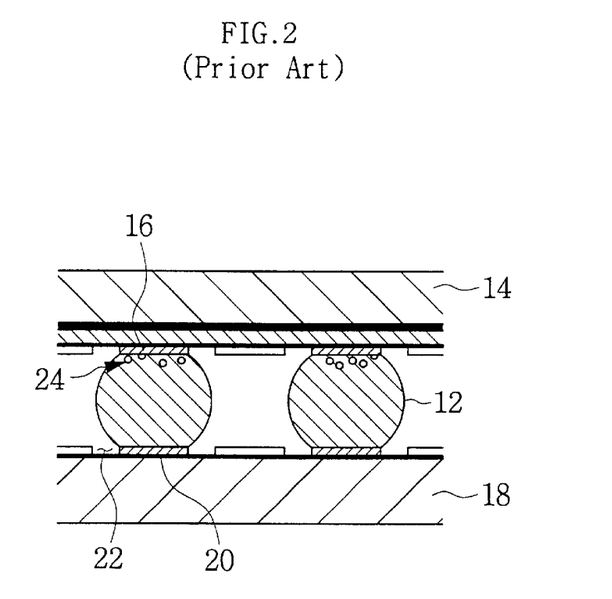
FIG. 2 illustrates a cross-sectional area of a conventional BGA structure, wherein small voids due to insufficient conventional wetting are shown at the junction of conductor pad and solder ball.

FIG. 2 illustrates a cross-sectional area of a conventional BGA structure, wherein small voids 24 due to insufficient conventional wetting are shown at the junction of conductor pad 16 and solder ball 12. Such voids 24 are formed when each of the molten solder balls 12 wets on the conductor pad 16, and the flux in the solder paste compound flows outward from the center of the conductor pad 16. As the temperature of the solder compound rises further, the flux is vaporized and a major portion of the flux vapor is dissipated into the atmosphere. However, minor portion of this vapor remains trapped in solder ball 12 as it is cooled and forms the small voids 24 inside the solder ball 12.

The configurations shown in FIGS. 1 and 2 are susceptible to cracking at each joint connecting the rigid conductor pad 16 and the rigid solder ball 12 under application of opposing lateral forces on the planar elements 14 and 18. Such a failure of both the electrical connection and the mechanical mounting mechanism has heretofore precluded the use of epoxy-glass as a reliable substrate material for BGA applications, in favor of a more expensive ceramic material which has a CTE closer to that of the chip. A detailed joint interface of solder balls used in a conventional BGA type semiconductor device mounting construction is disclosed, for example, in U.S. Pat. No. 6,122,177 and PAJ No. 1998-209591. Detailed manufacturing assembly technical reports from International Business Machines Corporation, entitled "Doubled-Sided 4 Mb SRAM Coupled Cap PBGA Card Assembly Guide," and from Texas Instrument Corporation, entitled "MicroStar BGA Packaging Reference Guide," would also be beneficial to the reader.

The prior art addresses the presence of these small voids in the solder balls and a resulting joint embrittlement as significant problems. A small void in this context is defined as a gaseous volumetric displacement within the interior of a solder ball due to thermal expansion (i.e. boiling) of low-temperature solder flux solvents, since such gas material will remain trapped within a cooled solder structure. Conventional solder processing typically incorporates a warm-up period to allow time for de-gassing of such solvents, thereby minimizing such voids to yield a recommended finished total gaseous volume of less than 0.1% of the total solder structure volume. Disadvantageously, such heating can prematurely dry the solder paste included in the solder ball, leading to degraded electrical connections.

Thus, conventional BGA structures are not sufficient to prevent solder cracking or the breakage of solder ball interconnection, especially when used with a chip and an epoxy-glass substrate. Therefore, what is needed is a newly designed CSP with improved interconnection reliability, especially between the chip and the PCB, and a method of manufacturing of the same.

SUMMARY OF THE INVENTION

In a preferred embodiment of the present invention, improved reliability of solder ball connections in a ball grid array (BGA) semiconductor device can be attained by forming a large cavity in each finished solder ball structure or eliminating small voids in the board land structure of the annular metal patterns. Such cavities can be controllably formed via a seeding catalyst in the form of an annular ring in contact with a solder ball having a volatile fluxing agent. During melting of the solder ball, the vaporized fluxing agent accumulates around the non-conductive hole in the annular ring and effectively "inflates" the solder ball, such that, when cooled, a hollow solder structure having flexible thin walls results that can absorb subsequent lateral movement of the opposing planar elements without degrading the solder joint. This is particularly useful in applications where thermal stresses generated during the thermal cycling can be absorbed or dissipated efficiently without breakage or degradation of the joints (physical connection) between the hollow conductive solder balls and the underlying structure.

Accordingly, a solder structure according to preferred embodiments of the present invention provides added resiliency to the overall solder bond by inducing the creation of a large gaseous cavity within the resulting solder structure. The presence of such a cavity produces a thin walled "barrel" shape solder structure that has sufficient resiliency and flexibility to "bend" under laterally applied stresses, thereby removing stress vectors that would occur at each joint between a conductor pad 16 and a conventional solder ball 12.

It is a feature of a preferred embodiment of the present invention to provide a solder structure for electrically and mechanically connecting a first metal contact on a first planar surface to a second metal contact on a second planar surface, the solder structure comprising a solder element having a curved exterior surface enclosing a first volume and an interior cavity having a displacement constituting a second volume. The solder structure consists of hollow cylindrical solder structure that can be circular (produced by a circular contact pad on one planar surface and an annular contact pad on the opposing planar surface) or "barrel-shaped" (produced by an annular contact pad on both opposing planar surfaces), further comprising a cylindrical exterior wall connected to conductive pads on each of the two planar surfaces being joined, and an interior cavity having a volumetric displacement that comprises between 1 and 90% of the total volumetric displacement of the solder structure. A solder compound can be used to attain the above resilient solder structure that can be comprised of a mixture of one or more from the group consisting of solder, silver, tin, and a solder fluxing, comprising one or more from the group consisting of rosin, resin, activator, thixotropic agent, and a high temperature boiling solvent.

It is another feature of a preferred embodiment of the present invention that a plurality of geometric configurations of the conductive pads in contact with the solder balls can cause cavities to form at the center of such geometries during heating of the solder ball to at least the melting point and subsequent cooling. One such geometry is an annular ring having a center hole sufficiently large to overcome the surface tension of a liquid drop of solder resting at wetting equilibrium on a solid surface. One such geometry features the diameter of the hole in annular metal land pattern as being less than 90% of the outer diameter of the annular metal land pattern. Another geometry features a diameter of the solder ball as being greater than the outer diameter of the annular metal land pattern. Another geometry features a mass of the solder material as being less than a mass of the fluxing material. Still another geometry features a weighted proportion of the solder material as being less than a weighted proportion of the fluxing material.

It is another feature of a preferred embodiment of the present invention to provide a method for creating such a resilient solder structure, such method comprising the steps of: 1) etching the first metal contact, further comprising an annular land pattern; 2) etching the second metal contact, further comprising a circular land pattern; 3) placing a generally spherical soldering means in contact with the annular land pattern; 4) positioning the second planar surface parallel to the first planar surface with the second metal contact contacting the spherical solder means; 5) applying a heating means to change the state of the soldering means to a molten state; 6) maintaining temperature for a predetermined amount of time in order for the molten solder to reflow across the surface of the first and second metal contacts; and 7) reducing the heat to allow the soldering means to return to a solid state. The method can additionally include a step of etching a hole in the second metal contact to create an annular ring. This step in combination with the opposing annular ring can be used to create the barrel-shaped solder structure.

These and other features of the present invention will be readily apparent to those of ordinary skill in the art upon review of the detailed description that follows.

DESCRIPTION OF THE PREFERRED EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shapes and thickness of elements may be exaggerated for clarity, and the same reference numerals appearing in different drawings represent the same element.

Figure 3:
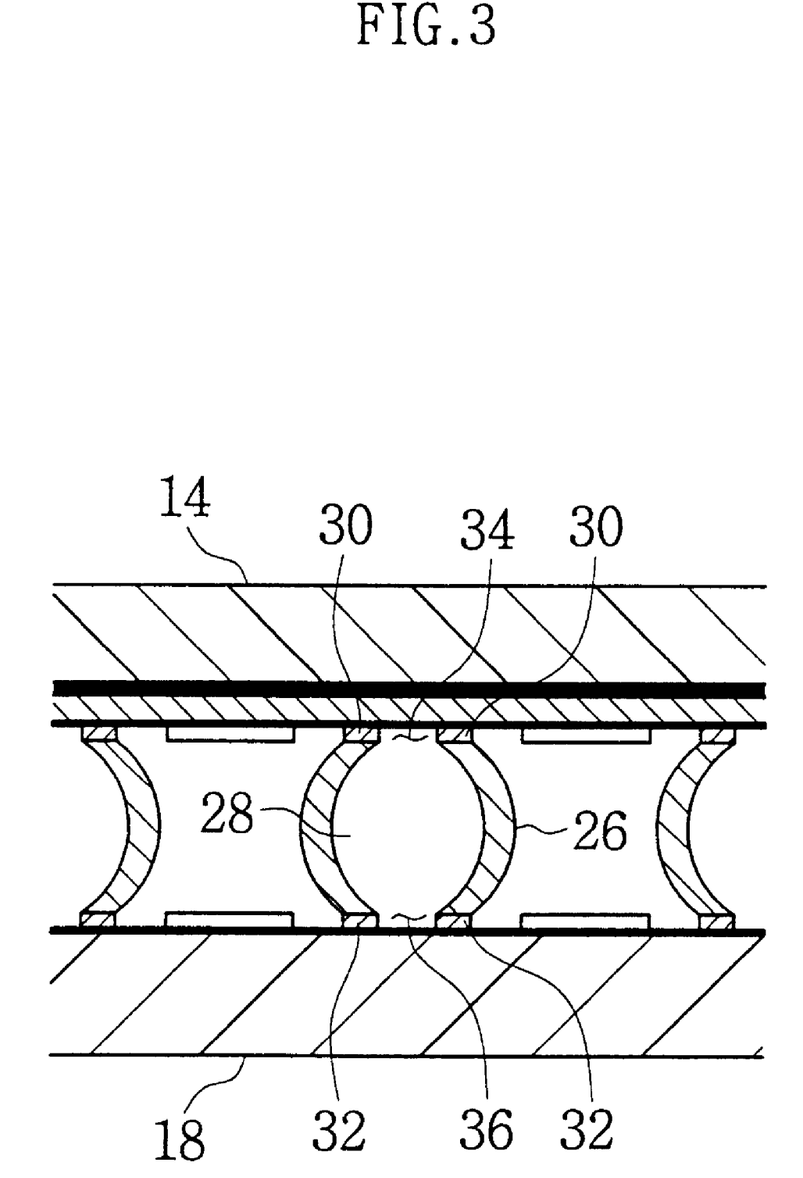
FIG. 3 illustrates a cross-sectional view of a barrel-shaped solder structure featuring a large void according to a preferred embodiment of the present invention.

FIG. 3 illustrates a cross-sectional view of a barrel-shaped solder structure 26 featuring a large central cavity 28 according to a preferred embodiment of the present invention. Through the use of an annular conductor pad 30 on upper planar element 14 rather than a circular one 16, a first "seeding" point is created for the accumulation of vaporized flux at the non-conducting/non-wetting center of the annulus. As the vapor expands during solder heating and liquefication, a first interior cavity is formed that is contained by the surface tension and viscosity of the molten solder. By including a second seeding point in an opposing annular conductor pad 32 on lower planar element 18, a second interior cavity is started that joins with the first interior cavity to produce the resulting interior cavity 28. The surface tension properties force the formation of an exterior convex shape on the liquefied structure, that when cooled, solidifies in the barrel-shaped form of FIG. 3, since the outer shell solidifies before the vaporized fluxing agent in the interior contracts.

During heating, the solder compound does not wet at hole areas 34 and 36 of annular conductor pads 30 and 32 under an epoxy resin (or polyimide tape) because the contact angle is 180° between the epoxy resin (or polyimide tape) and solder ball 26. Exemplary land holes 34 and 36 are approximately 0.1 mm diameter. The small voids surrounding the land holes 34 and 36 merge and become concentrated, and the large void 28 is initiated at these point. Relative volumes of the cavity can range from 1% to 90% of the total volume of the solder structure. The volume of the cavity may be controlled by controlling the temperature and time during heating of the solder. The composition of the solder should balance the properties of the solder and solder-alloys with the properties of a fluxing vapor. Specifically, an exemplary solder compound can consist of portions any of the general soldering materials, such as solder, silver, and tin, and a fluxing agent, such as one or more from the group of rosin, resin, activator, thixotropic agent, and a high temperature boiling solvent.

Figure 4:
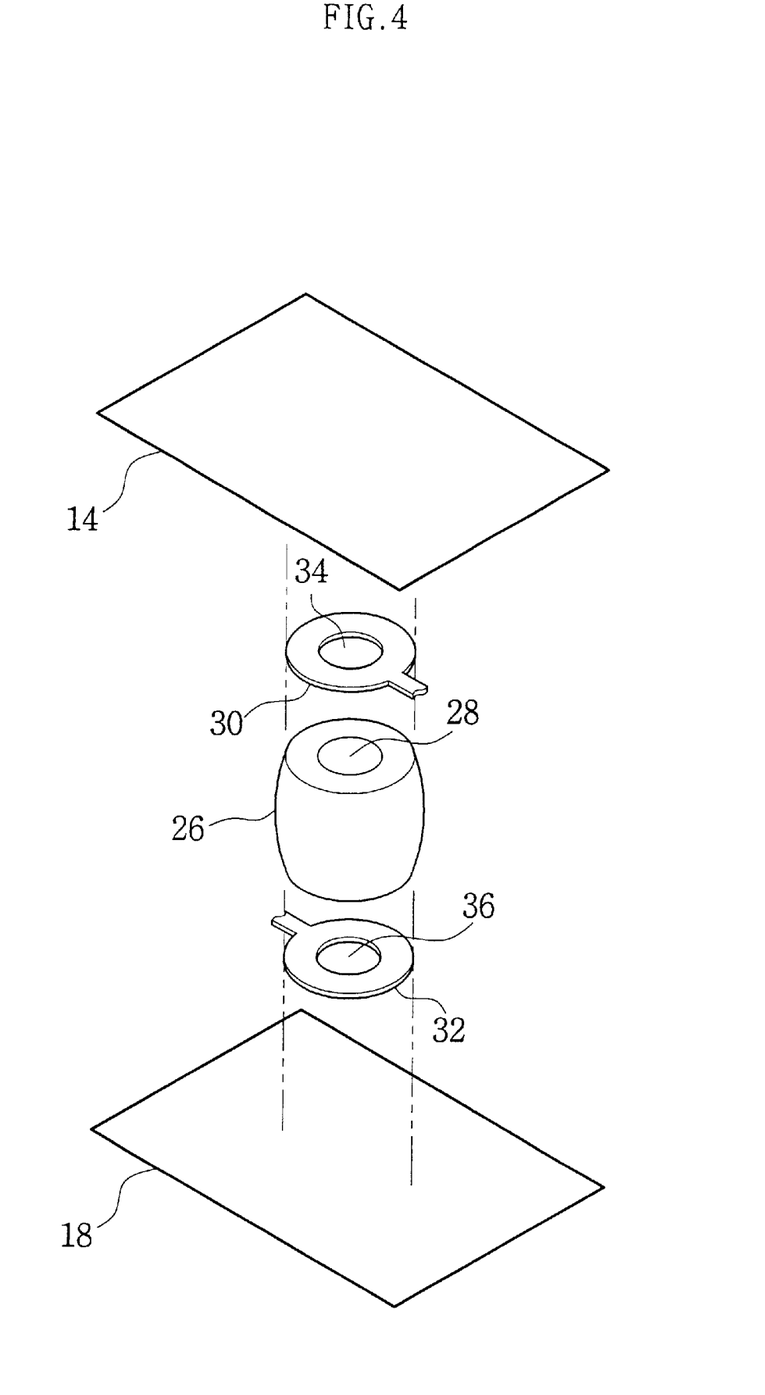
FIG. 4 illustrates am exploded view of the elements shown in FIG. 3.

FIG. 4 illustrates an exploded view of the elements shown in FIG. 3. Annular conductor pad 30 having hole 34 is etched or deposited on planar element 14, and annular conductor pad 32 having hole 36 is etched or deposited on planar element 18. Flexible barrel-shaped solder structure 26 and central cavity 28 connect the two planar elements in a semi-rigid arrangement. To better understand the relative sizes of the different elements in FIG. 4, exemplary dimensions can be 0.1 mm for the diameter of the annular hole, 0.4 mm for the outer diameter of the annular ring, and 0.45 mm for the initial diameter of the solder ball. These dimensions are exemplary only and are not meant to limit the scope of the invention. The hole diameter needs only be large enough such that the solder will part and flow away from the center of the hole by way of surface tension as well as both cohesive and adhesive forces. Additionally, the solder ball need only be sufficiently larger than the outer diameter of the annular ring such that the molten solder will make contact with and reflow to all portions of exposed metal of the annular ring and form a continuous outer shell without irregularities or discontinuities, either of which can be initiation points for metal fatigue.

Figure 5:
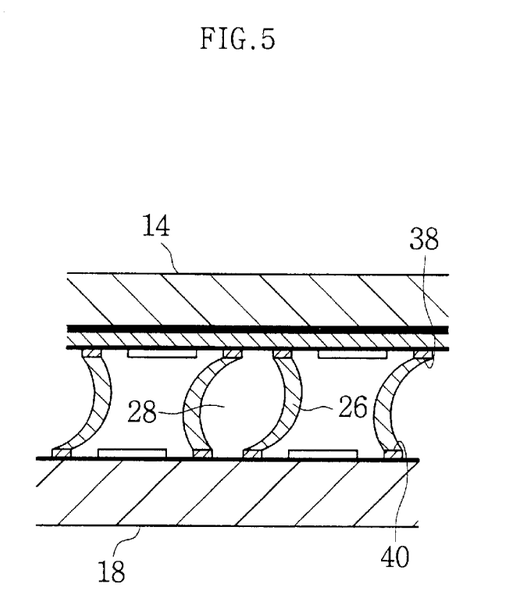
FIG. 5 illustrates a cross-sectional view of the solder structure shown in FIG. 3 under conditions where lateral stress forces are applied to the planar elements in directions that tend to move planar elements in opposite directions.

FIG. 5 illustrates a cross-sectional view of the solder structure shown in FIG. 3 under conditions of lateral stress forces being applied in directions that tends to move planar elements 14 and 18 in opposite directions. The skew of barrel-shaped solder structure 26 illustrates the bending motion of the flexible walls of solder structure 26 such that potentially destructive stress forces are neutralized and reduced or removed from junction areas 38 and 40.

Figure 6:
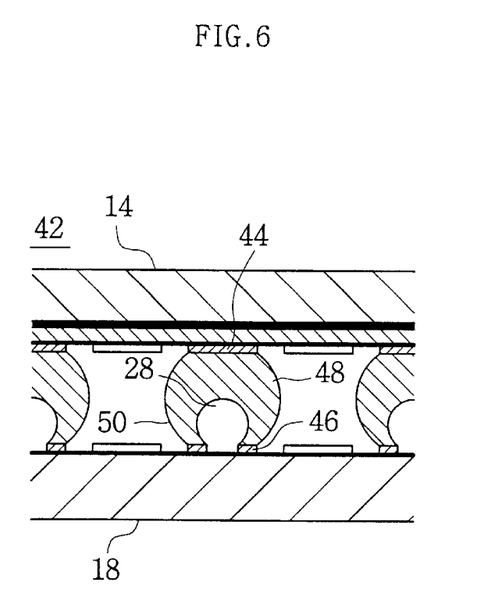
FIG. 6 illustrates a cross-sectional view of a solder structure according to an alternative embodiment of the present invention wherein one planar element has an annular conductor pad and the other planar element has a circular conductor pad.

FIG. 6 illustrates a solder structure 42 according to an alternative embodiment of the present invention, wherein planar element 14 has a circular conductor pad 44, and planar element 18 has an annular conductor pad 46. This arrangement creates a solder structure 48 having a circular or tear-drop shape, that still retains the thin flexible walls 50. The annular conductor pad can be located on either the upper planar element 14 or the lower planar element 18, with the circular conductor pad on the opposite surface with the result that there is an attendant effect that locates the cavity coincident with the hole of the annulus.

Figure 7:
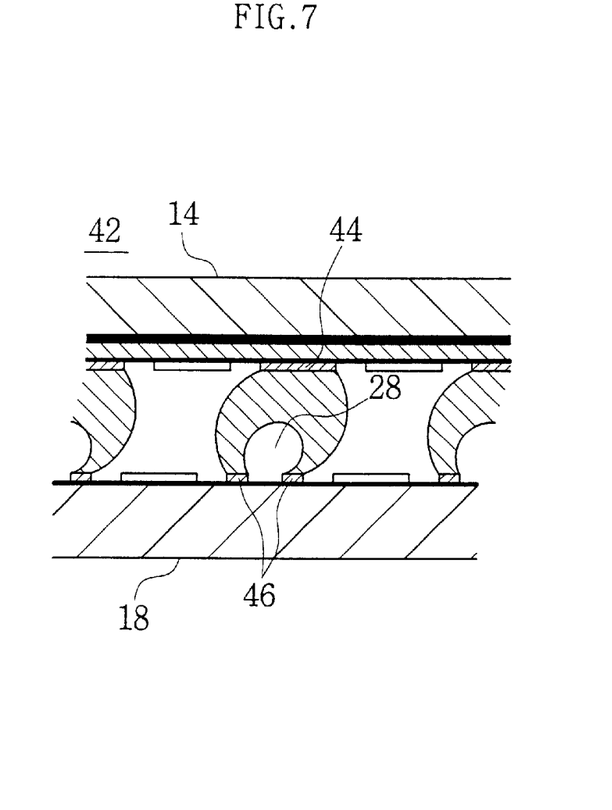
FIG. 7 illustrates the bending motion in responses to lateral stress forces similar to those shown in FIG. 5.

FIG. 7 illustrates the bending motion of the solder structure shown in FIG. 6 in response to lateral stress forces similar to those shown in FIG. 5. Similar to the structure shown in FIG. 5, the potentially destructive stress forces are neutralized or absorbed by the flexible walls of the solder structure and reduced or eliminated at the junctions 44 and 46 between solder ball 48 and the planar elements 14 and 18, respectively. Although the solder structure of FIG. 7 is shown to have thicker walls, manipulation of the solder composition and applied thermal parameters, including both variations of temperature and time, can produce a wall thickness of any desired dimension.

The size of the resulting cavity 28 is dependent on several physical and chemical factors, including without limitation: flux-solder weight ratios composing the solder compound; type and properties of the solder materials included in the solder compound; type and relative vaporization or boiling point of the fluxing agent used; relative size of the central hole in the annular ring 34 and 36 to the diameter of the annulus 30 and 32; relative size of the annulus versus the initial diameter of the spherical solder ball 26 and 48; relative separation distance of planar elements 14 and 18 versus the diameter of the spherical solder ball 26 and 48; and rates, magnitudes, and dwell times of temperature changes on the assembly. Further, different qualitative measurements can be used. For example, although mixing the solder compound by weight is a convenient measure for determining relative portions of each element, volumetric measure can also be used. Determination of a resultant solder structure can also be addressed as a ratio of gas versus solder volumes, wall thickness versus total diameter of the structure width dimension, or cavity diameter versus planar separation distance, and still be within the scope of the present invention.

Figure 8:
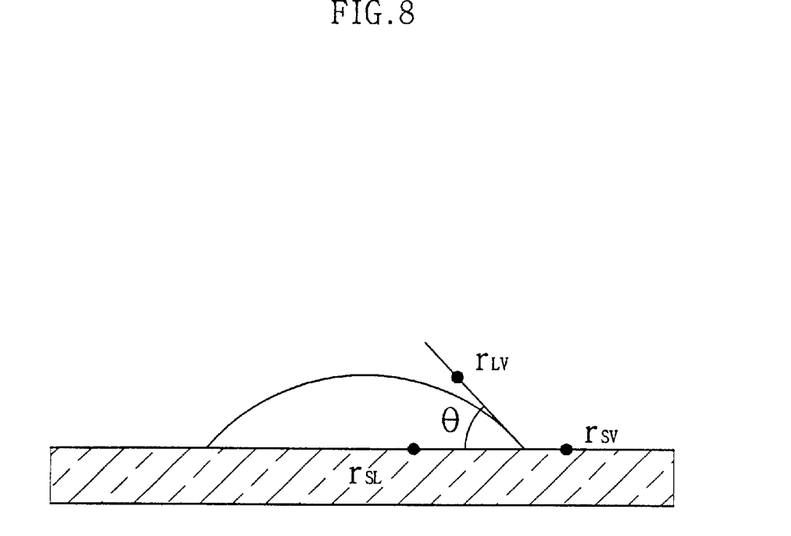
FIG. 8 shows a liquid drop resting at wetting equilibrium on a solid surface.

FIG. 8 shows a liquid drop resting at wetting equilibrium on a solid surface. The shape of the spherical cavity of FIG. 6 and the barrel cavity of FIG. 3 is determined by the surface tension and wetting property of the liquid solder. For example, the cavity of barrel 26 shown in FIG. 3 can be easily manufactured by using the wetting property of which growth starts from the edge of copper land holes 34 and 36 with a predetermined contact angle. The detailed wetting equilibrium on a solid surface is disclosed in, for example, Kinloch, A. J., Adhesion and Adhesives: Science and Technology, Chapman and Hall, 1987 and Kitano, M. and Honda, M., "Shape prediction of solder bump joint by surface tension analysis and fatigue strength evaluation," Advanced in Electronic Packaging, ASME, 1997, pp. 1407–1412.

The Young equation relating the surface tensions to the equilibrium contact angle, θ, represents the wetting equilibrium at three-phase (liquid solder, copper land and void) contact points, can be written as:

$$\gamma_{SV} = \gamma_{SL} + \gamma_{LV} \cos\theta. \qquad (1)$$

where, $\gamma_{SL}$ and $\gamma_{LV}$ are surface tensions at solid (copper land)/liquid (solder) and liquid (solder)/vapor (void), respectively. The term $\gamma_{SV}$ means the surface free energy of the solid substrate resulting from adsorption of vapor from the liquid and may be considerably lower in value than the surface free energy of solid in vacuum, $\gamma_S$.

Surface tension always exists whenever there is a density discontinuity, as for example, between a solder and air or water and oil. Both the inner and outer surface shapes of the solder structure shown in FIGS. 3 and 6 may be mathematically described with the Laplace equation (2) and the Bernoulli equation. The Laplace equation representing the relationship between the pressure difference, Δp, and the surface tension, $\gamma$, is $$\Delta p = \gamma (1/R_1 + 1/R_2), \qquad (2)$$

where $R_1$ and $R_2$ are the principal radii of curvature of the surface. The Bernoulli equation (3) considers the effect of the gravity force $$p = p0 - \rho g h, \qquad (3)$$

where pressure p inside the liquid solder is expressed in terms of the reference pressure, p0, and the multiplication of the density of the solder ρ, the acceleration of gravity g and the height from the reference point h.

Figure 9:
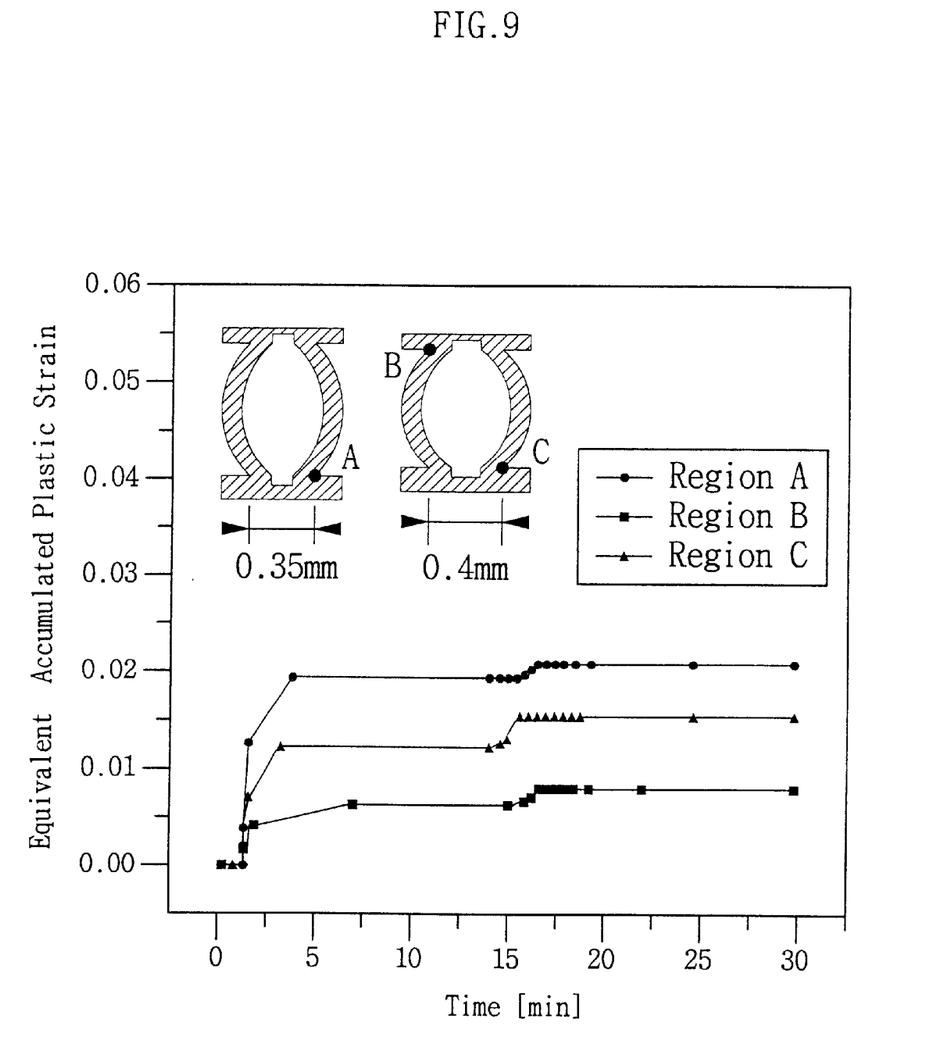
FIG. 9 illustrates a diagram showing the equivalent plastic strain at different regions of barrel solder structure over time.
Figure 10:
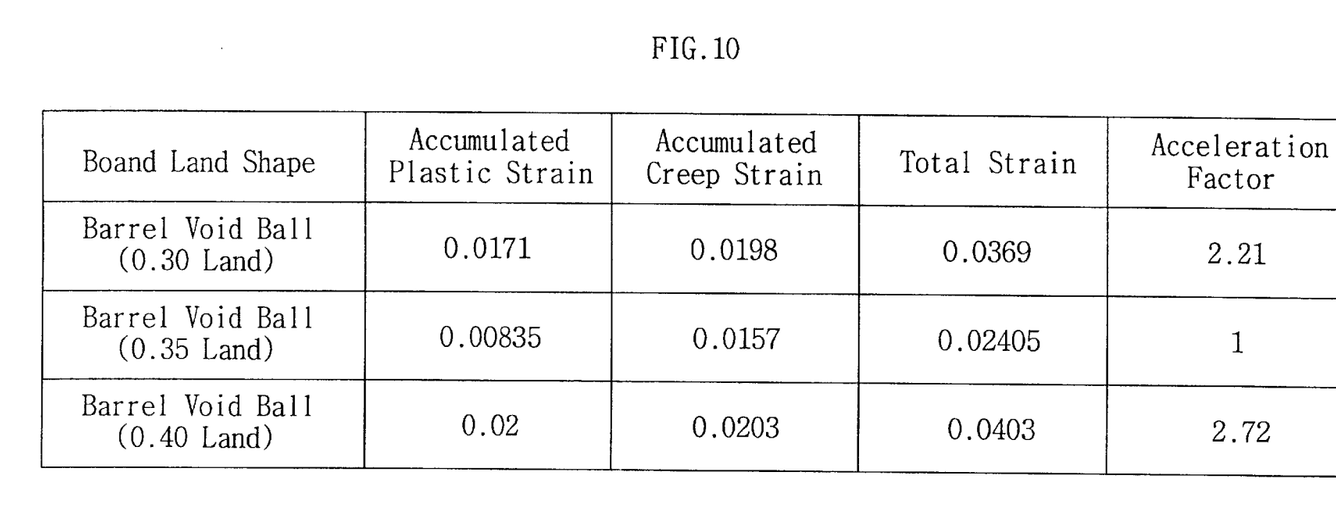
FIG. 10 illustrates a table showing the values corresponding to the diagram shown in FIG. 9.
Figure 11:
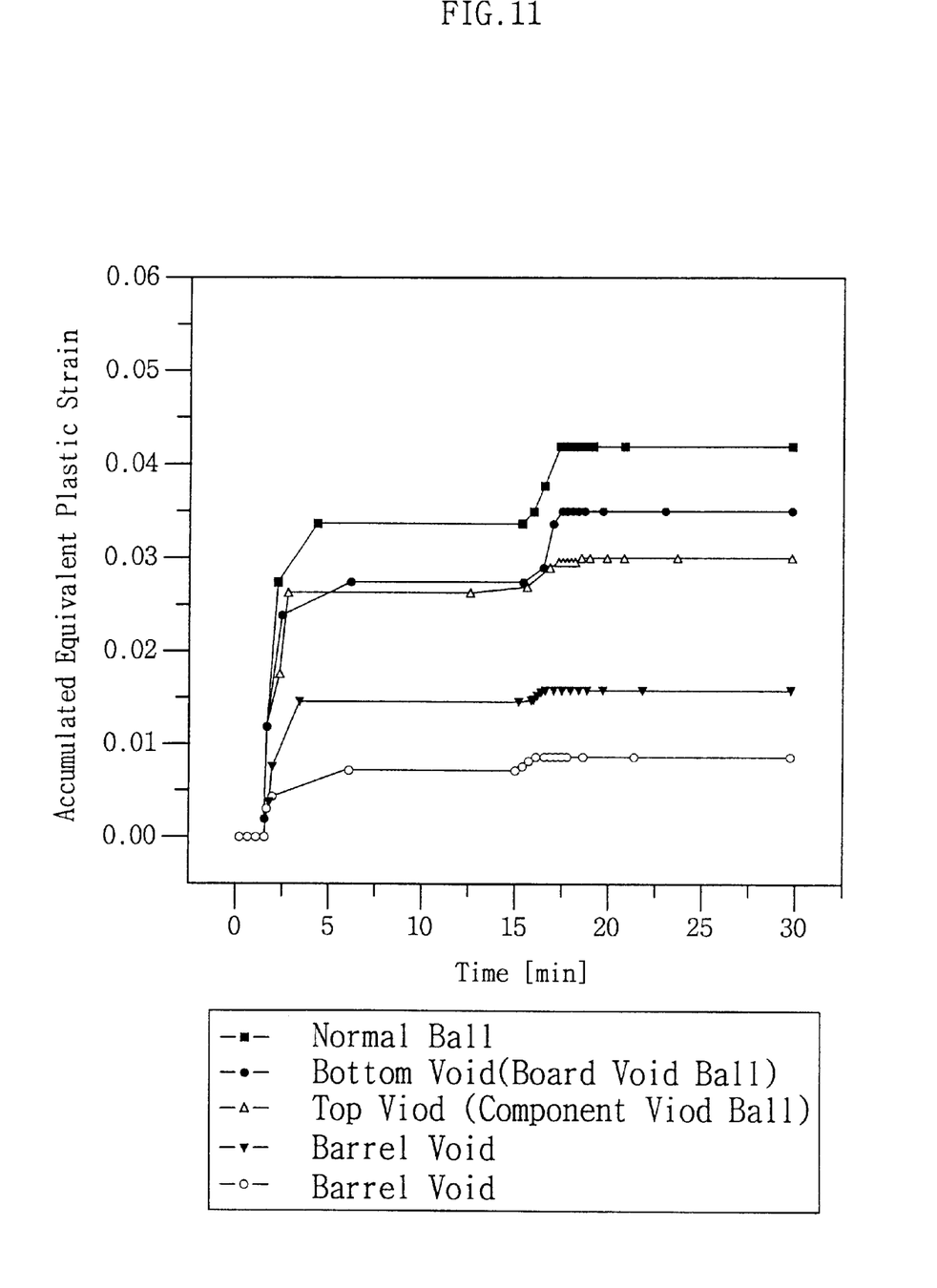
FIG. 11 illustrates a diagram showing the accumulated equivalent plastic strain for the different configurations that were shown in FIGS. 1–6.
Figure 12:
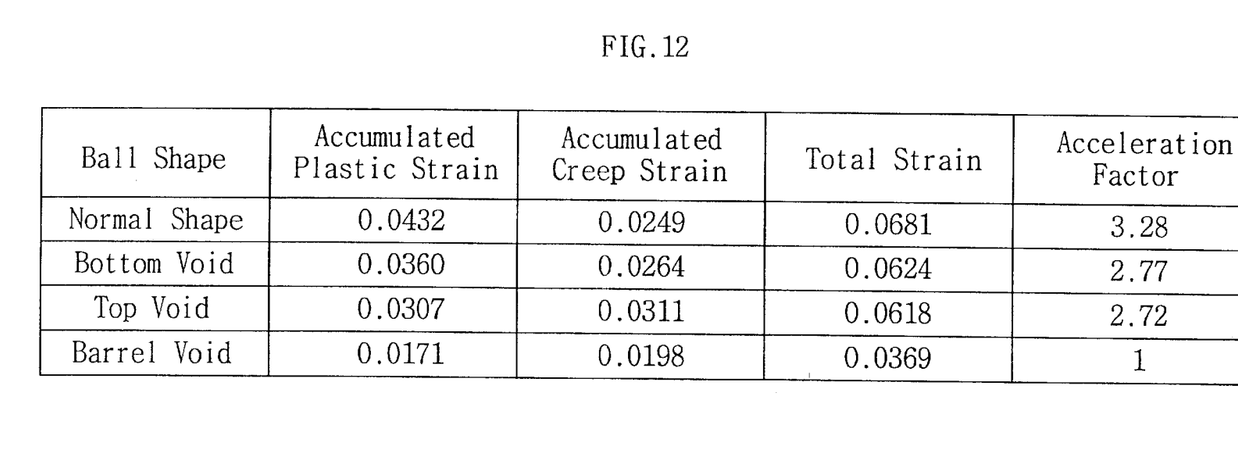
FIG. 12 illustrates a table showing the values corresponding to the diagram shown in FIG. 11.

FIGS. 9 to 12 illustrate the results of a representative thermal analysis of the finished solder structures. FIG. 9 illustrates a diagram showing the equivalent plastic strain at different regions, A, B, and C, of barrel solder structure 26 over time. FIG. 10 illustrates a table showing the values corresponding to the diagram shown in FIG. 9. For example, the 0.35 mm diameter of the land for the barrel solder structure has better strain resistance characteristics when compared to diameters of 0.30 mm or 0.40 mm. FIG. 11 illustrates a diagram showing the accumulated equivalent plastic strain for the different configurations that are shown in FIGS. 1–6. FIG. 12 illustrates a table showing the values corresponding to the diagram shown in FIG. 11.

From the drawing figures, the barrel-shaped solder structure 26 shown in FIG. 3 has significantly better strain absorption characteristics than either a conventional solder ball 12 shown in FIG. 1 (i.e. labeled "Normal Shape") or the "Teardrop-shaped" solder structure 42 shown in FIG. 6 (Labeled "Top" and "Bottom Voids" in the table of FIG. 12. Although the tear-dropped solder structure does not have the apparent resiliency of barrel solder structure 26, it still shows an improvement over the conventional solder ball structures 12 shown in the prior art of FIG. 1. Thus, with the preferred embodiments of the present invention, the stresses applied to the various joints can be significantly dissipated or reduced. Accordingly, interconnection reliability can be significantly improved in accordance with the present invention.

According to a preferred method for creating the foregoing resilient solder structures for mechanically joining two planar elements at the solder location of the present invention, the method comprises the steps of:

1) creating on a first planar element at least one circular metallic contact pad;

2) creating on a second planar element at least one annular metallic contact pad;

3) positioning a generally spherical solder element at the center of the annulus;

4) positioning the first planar element over the second planar element, such that the metallic contact pad of each planar element is horizontally aligned with respect to the planar elements, such that the contact pads are in vertically alignment and in contact with one another;

5) raising the temperature of the combined assembly to a predetermined temperature that causes the melting of the solder compound;

6) holding a melting/reflow temperature on the combined assembly for a predetermined amount of time in order for the planar elements to self-align with each other and to attain satisfactory solder adhesion to both planar elements; and 7) reducing the temperature in order to allow solidification of the solder into a semi-rigid structure having an interior cavity.

The solder element comprises a solder portion and a fluxing agent portion which are mixed according to a predetermined ratio in order to create a compound, the compound being characterized in that after melting and re-solidifying, a resulting solder structure will have an interior void that meets at least one of the following criteria: a) the volume of the interior cavity is at least 1% of the total volume of the solder structure; and b) the thickness of the solder wall at the thinnest point between the interior void and the exterior surface is less than 10% of the maximum cross-sectional lateral distance across the solder structure at the midpoint between the two planar elements.

It should be noted that different geometries and relative sizes of the upper and lower conductor pads can create different shaped solder structures and still fall within the scope of the present invention. Further, while the foregoing discussion is related to electrically and mechanically connecting a semiconductor integrated circuit to a substrate planar element, application of the hollow flexible mechanical structure of the present invention can be used solely in mechanical mounting systems for attaching planar elements together.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A solder structure for electrically and mechanically connecting a first metal contact on a first planar surface to a second metal contact on a second planar surface, comprising:

a soldering means having a curved exterior surface enclosing a first volume; and an interior cavity constituting a second volume, wherein the second volume comprises not less than 1% and not more than 90% of the first volume.

2. A solder structure as claimed in claim 1, wherein the solder structure comprises a hollow cylindrical solder structure, the hollow cylindrical solder structure having:

a cylindrical exterior wall;

a top connecting the cylindrical exterior wall to the first metal contact; and a bottom connecting the cylindrical exterior wall to the second metal contact.

3. A solder structure as claimed in claim 1, wherein the solder structure comprises a hollow circular solder structure, the hollow circular solder structure having:
- a generally circular exterior surface wall;
- a top connecting the circular exterior wall to the first metal contact; and
- a bottom connecting the circular exterior wall to the second metal contact.

4. A solder structure as claimed in claim 1, wherein the soldering agent comprises a mixture of one or more selected from the group consisting of solder, silver, tin, and a solder fluxing means.

5. The solder structure of claim 4, wherein the solder fluxing agent comprises one or more from the group consisting of rosin, resin, activator, thixotropic agent, and a high temperature boiling solvent.

6. A cylindrical solder joint for connecting a first electrical member to a second electrical member, comprising:
- a first annular conductive pad formed on the first electrical member;
- a second annular conductive pad formed on the second electrical member;
- a solder structure having an exterior wall having a first end and a second end, the first end being connected to the first annular conductive pad and the second end being connected to the second annular conductive pad; and
- a cavity enclosed by the exterior wall of the cylindrical solder structure.

7. A solder joint as claimed in claim 6, wherein the cavity communicates with an inner hole of the first annular conductive pad.

8. A solder joint as claimed in claim 7, wherein the cavity communicates with an inner hole of the second annular conductive pad.

9. A solder joint as claimed in claim 6, wherein the cylindrical solder structure has a barrel-shaped exterior.

10. A solder joint as claimed in claim 6, wherein the exterior wall of the solder structure is flexible.

11. A solder joint as claimed in claim 6, wherein a volume of the cavity of the cylindrical solder structure is not less than 1% and not more than 90% of an entire volume of the cylindrical solder structure.

12. A solder joint as claimed in claim 6, wherein a material of the solder structure comprises a solder fluxing agent and a mixture of one or more selected from the group consisting of solder, silver, and tin.

13. A solder joint as claimed in claim 12, wherein the solder fluxing agent comprises more than one selected from the group consisting of rosin, resin, activator, thixotropic agent and a high temperature boiling solvent.

* * * * *